United States Patent [19]

Oikawa

[11] Patent Number: 5,432,126
[45] Date of Patent: Jul. 11, 1995

[54] FABRICATION PROCESS OF COMPOUND SEMICONDUCTOR DEVICE COMPRISING L-SHAPED GATE ELECTRODE

[75] Inventor: Hirokazu Oikawa, Tokyo, Japan

[73] Assignee: NEC Corporation, Tokyo, Japan

[21] Appl. No.: 301,586

[22] Filed: Sep. 7, 1994

[30] Foreign Application Priority Data

Sep. 7, 1993 [JP] Japan .................. 5-221565

[51] Int. Cl.$^6$ ............................................ H01L 21/44
[52] U.S. Cl. ................................. 437/177; 437/176; 437/912; 437/203; 148/DIG. 111
[58] Field of Search .............. 437/176, 177, 203, 912, 437/41; 148/DIG. 106, DIG. 111

[56] References Cited

U.S. PATENT DOCUMENTS

| | | | |
|---|---|---|---|
| 4,536,942 | 8/1985 | Chao et al. | 437/176 |
| 4,551,905 | 11/1985 | Chao et al. | 437/176 |
| 4,599,790 | 7/1986 | Kim et al. | 437/912 |
| 4,997,778 | 3/1991 | Sim et al. | 437/912 |
| 5,053,348 | 10/1991 | Migura et al. | 437/912 |
| 5,304,511 | 4/1994 | Sakai | 437/912 |
| 5,358,885 | 10/1994 | Oku et al. | 437/203 |

*Primary Examiner*—Brian E. Hearn
*Assistant Examiner*—Leon Radomsky
*Attorney, Agent, or Firm*—Sughrue, Mion, Zinn, Macpeak & Seas

[57] ABSTRACT

After forming a silicon oxide layer and an amorphous silicon layer on a GaAs substrate in stacking manner, a gate electrode forming opening portion is formed by RIE etching. Then, by selectively removing only the amorphous silicon layer at the portion contacting with the opening portion at the side of the source electrode, a WSi•TiN•Pt layer is formed within the opening portion. Subsequently, after applying an organic photoresist layer, an entire surface is etched back to remove at least the WSi•TiN•Pt layer above the amorphous silicon layer. Then, by using the WSi•TiN•Pt layer remaining in the opening portion as a plating electrode, an Au layer is plated to form a reversed L-shaped gate electrode with an overhanging portion only extending toward the source electrode.

12 Claims, 5 Drawing Sheets

FABRICATION PROCESS OF COMPOUND SEMICONDUCTOR DEVICE COMPRISING L-SHAPED GATE ELECTRODE

BACKGROUND OF THE INVENTION

1. Field of the Invention

The present invention relates generally to a fabrication process of a compound semiconductor device. More specifically, the invention relates to a fabrication process of a compound semiconductor device, which includes an improved process for formation of a gate electrode.

2. Description of the Related Art

In a compound semiconductor device frequently used as an amplifier element at a microwave band and an extreme high frequency band, a gate electrode having T-shaped cross-section is employed for shortening gate length (hereinafter referred to as "Lg") and providing large cross-sectional area of the gate electrode, for improving a high frequency characteristics.

FIG. 1A is a section showing one example of the conventional compound semiconductor device having T-shaped gate electrode. As shown in FIG. 1A, a source electrode 9 and a drain electrode 10 are formed on a GaAs substrate 1. On the surface of the substrate at the position between the source electrode 9 and the drain electrode, a gate electrode 8 having T-shaped cross-section is formed.

However, in the conventional compound semiconductor device having the T-shaped gate electrode 8, due to presence of "overhanging portion" of the gate electrode 8, a parasitic capacitance between the gate electrode and the source and drain electrodes 9 and 10 is increased. Among these parasitic capacitances, the parasitic capacitance $C_{GS2}$ between the gate and source is smaller than an intrinsic capacitance $C_{GS1}$ and thus gives little influence to the characteristics of the device. On the other hand, the parasitic capacitance $C_{GD2}$ between the gate electrode and the drain electrode significantly influences to the characteristics of the device since the intrinsic capacitance $C_{GD1}$ between the gate electrode and the drain electrode is small. Therefore, increasing of the parasitic capacitance inherently causes lowering of a maximum effective power gain which degrades high frequency characteristics of the device.

One example of a solution for this has been disclosed in Japanese Unexamined Utility Model Publication (Kokai) No. Showa 63-188964, in which is disclosed a compound semiconductor device having a substantially reversed L-shaped gate electrode having the "overhanging portion" at the side of the source, as shown in FIG. 1B. Namely, while the compound semiconductor device illustrated in FIG. 1B has the overhanging portion extending toward the source electrode 9, the gate electrode does not extend toward the drain electrode 10. With this construction, high frequency characteristics can be improved without increasing the gate-drain parasitic capacity.

FIGS. 2A to 2E are sections showing steps in fabrication of the conventional compound semiconductor device shown in FIG. 1B.

At first, on the GaAs substrate 1 formed with an active layer, a silicon oxide film of 400 nm thick is formed by way of LPCVD method. Then, employing an etching gas, such as $CHF_3$, $CF_4$ or $SF_4$ and so forth, the silicon oxide film is selectively dry-etched to form an opening 2a for forming the gate electrode by lithographic technology.

Then, on the surface, side surface of the silicon oxide layer including the opening and the surface of the substrate 1 within the opening 2a, a 200 nm thick tungsten silicide (WSi) layer, a 100 nm thick titanium nitride (TIN) layer and a 20 nm thick platinum (Pt) layer are stacked in order by deposition method or sputtering method. A stacked layer 6 (hereinafter also referred to as WSi•TiN•Pt film) thus formed forms a part of the gate electrode.

Next, as shown in FIG. 2B, a photoresist layer 4 with a reversed taper form opening is formed on the surface including the opening portion 2a by way of image reversing method or lithographic technology. At this time, the side surface 4a of the opening portion of the photoresist layer 4 at the side of the drain electrode is aligned with the side wall of the gate electrode forming opening portion 2a. On the other hand, the side surface 4b of the opening portion of the photoresist layer 4 at the side of the source electrode is shifted away from the edge of the gate electrode forming opening portion 2a to the extent of 0.2 to 1.0 μm.

Next, as shown in FIG. 2C, using the photoresist layer 4 as a mask, a 700 nm thick gold (Au) layer is plated on the WSi•TiN•Pt layer 6 to form the reversed L-shaped gate electrode 8.

Subsequently, as shown in FIG. 2D, after removing the photoresist layer 4, using the gate electrode 8 as a mask, etching of the WSi•TiN•Pt layer 6 is performed with a reactive ion etching method (hereinafter referred to as RIE) to remove the portion not covered by the gate electrode 8. At this time, by removing the WSi•TiN•Pt layer 6 employing $BCl_3$ type gas or $Cl_2/CF_4$ type gas, the etching amount of the gate electrode formed of the Au layer can be limited to be approximately 100 nm.

Next, as shown in FIG. 2E, the silicon oxide layer 2 at the positions of the source electrode and the drain electrode is selectively removed, and the source electrode 9 and the drain electrode 10 are formed selectively.

Through the process set forth above, the semiconductor device having the reversed L-shaped gate electrode having the overhanging portion only at the side of the source electrode is thus formed.

However, since the above-mentioned conventional compound semiconductor device fabrication method forms the reversed L-shaped gate electrode by aligning the side surface 4a of the opening portion of the photoresist layer for masking in plating at the side of the drain electrode to the side wall of the gate electrode forming the opening portion 2a, and shifting the side surface 4b at the side of the source electrode away from the edge of the gate electrode forming opening portion 2a to the extent of 0.2 to 1.0 ρm, the margin when the mask for the photoresist layer 4 is aligned is zero.

FIGS. 3A and 3B and FIGS. 4A and 4B are sections of a semiconductor chip during the fabrication process for illustrating problems in the conventional compound semiconductor device fabrication process.

At first, as shown in FIG. 3A, when the side surface 4a of the opening portion of the photoresist layer at the side of the drain electrode is offset from the edge of the gate electrode forming opening portion 2a toward the drain electrode in the magnitude of Da, the gate electrode 8 becomes T-shaped configuration instead of the reversed L-shaped configuration, as shown in FIG. 3B. In this case, the gate-drain parasitic capacity $C_{GD2}$ becomes large to lower the maximum effective power gain and thus causes degradation of the high frequency characteristics.

On the other hand, as shown in FIG. 4A, when the side surface 4a of the opening portion of the photoresist layer 4 at the side of the drain electrode is offset from the edge of the gate electrode forming opening portion 2a toward the source electrode in the magnitude of Db, while the reversed L-shaped gate electrode is formed, the gate length thereof becomes shorter than the desired value as shown in FIG. 4B to make it impossible to attain the desired high frequency characteristics. Furthermore, residue of the WSi•TiN•Pt layer as the first metal layer within the gate electrode forming opening portion 2a can be caused. Such residual WSi•TiN•Pt layer may cause leakage between the electrodes to degrade characteristics of the device.

SUMMARY OF THE INVENTION

It is, therefore, an object of the present invention to provide a fabrication method of a compound semiconductor device which can form a reversed L-shaped gate electrode with overhanging portion not extending toward the drain side but extending only toward the source side with a precise margin when the mask for the photoresist layer is aligned, and whereby can minimize gate-drain parasitic capacity $C_{GD}$ and thus improve maximum effective power gain and high frequency characteristics.

According to the present invention, a fabrication process of a compound semiconductor device comprises the steps of:

first step of forming a first insulation layer on an active layer provided in a compound semiconductor substrate;

second step of forming an insulative or a semi-insulative second layer on the first insulation layer, which second layer permitting selective etching with respect to the semiconductor substrate and the first insulation layer;

third step of forming a first opening portion for forming a gate electrode by locally and selectively etching the first insulation layer and the second layer sequentially for exposing the surface of the semiconductor substrate;

fourth step of forming a second opening portion having upper portion common to the first opening portion by locally and selectively etching the second layer in the portion connected to the first opening portion at the side of source electrode;

fifth step of forming a first metal layer establishing a Shottky coupling with the semiconductor substrate over a surface including the first and second opening portions;

sixth step of removing at least a portion the first metal layer positioned above the first later by applying a photoresist layer over entire surface for flattening the surface and subsequently etching back the photoresist layer; and seventh step of forming a reversed L-shaped gate electrode having a head portion extending toward the side of the source electrode by filling a second metal layer in the first and second opening portions by electroplating by taking the first metal layer remaining in the first and second opening portions as a plating electrode.

With the construction set forth above, the present invention permits formation of the reversed L-shaped gate electrode with extending the overhanging portion only toward the source side and without extending the overhanging portion toward the drain side and with a precise margin when the mask for the photoresist layer is aligned. Thus, a gate-drain parasitic capacity $C_{GD2}$ can be made small to achieve improvement of maximum effective power gain and high frequency characteristics.

For example, in the semiconductor device having the gate electrode with 0.5 μm of gate length Lg, 300 μm of gate width and 1.0 μm of the length of head portion of the gate electrode formed on an active layer having $1 \times 10^{17}$ cm$^{-3}$ of carrier density and 100 nm of thickness, gate-drain parasitic capacity $C_{GD2}$ becomes approximately 0.02 pF and intrinsic capacity $C_{GD1}$ is approximately 0.04 pF, gate-source parasitic capacity $C_{GS2}$ becomes approximately 0.02 pF and intrinsic capacity $C_{GS1}$ becomes approximately 0.4 pF, in the case where the gate electrode has T-shaped cross-section. On the other hand, in the case of the reversed L-shaped gate electrode, gate-drain parasitic capacity $C_{GD2}$ becomes less than 0.01 pF and gate-source parasitic capacity $C_{GD2}$ is approximately 0.04 pF. Namely, with employing the reversed L-shaped gate electrode, gate-source capacity $C_{GS}$ increases little and the gate-drain capacity $C_{GD}$ decreases by approximately ⅔ of the case of the T-shaped gate electrode. By this, the maximum effective power gain can be improved to the extent of 1.5 to 2 dB.

BRIEF DESCRIPTION OF THE DRAWING

The present invention will be understood more fully from the detailed description given herebelow and from the accompanying drawings of the preferred embodiment of the present invention, which, however, should not be taken to be limitative to the invention, but are for explanation and understanding only.

In the drawings.

DESCRIPTION OF THE PREFERRED EMBODIMENT

The preferred embodiment of a compound semiconductor device fabrication process according to the present invention will be discussed hereinafter in detail with reference to FIGS. 5A to 5F. In the following description, numerous specific details are set forth in order to provide a thorough understanding of the present invention. It will be obvious, however, to those skilled in the art that the present invention may be practiced without these specific details. In other instance, well-known structures are not shown in detail in order to unnecessary obscure the present invention.

Figure 1A:
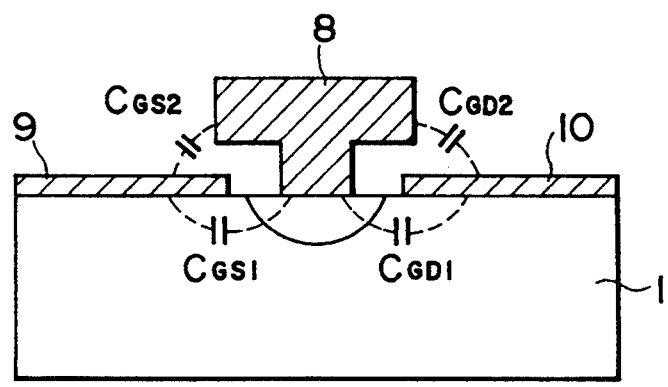
FIGS. 1A and 1B are sections showing one example of the conventional compound semiconductor devices.
Figure 1B:
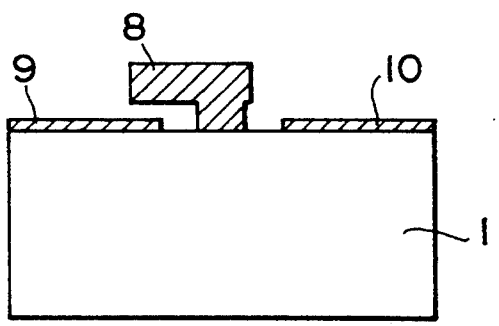
Figure 2A:
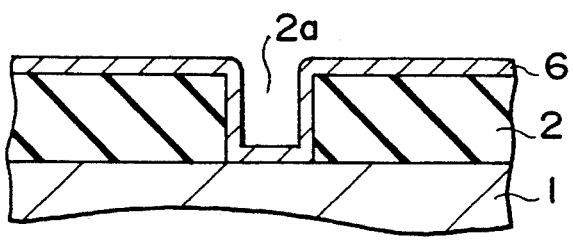
FIGS. 2A to 2E are sections showing a sequence of process steps in the conventional compound semiconductor device fabrication process.
Figure 2B:
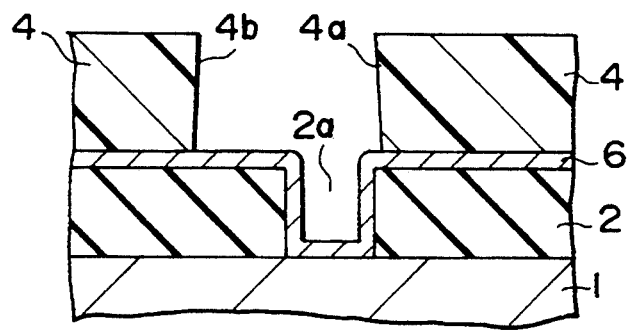
Figure 2C:
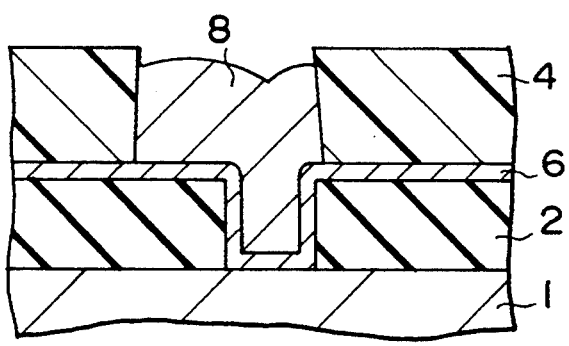
Figure 2D:
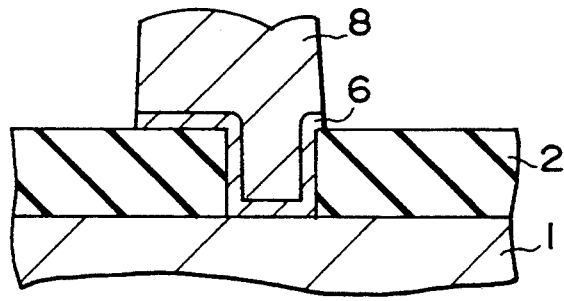
Figure 2E:
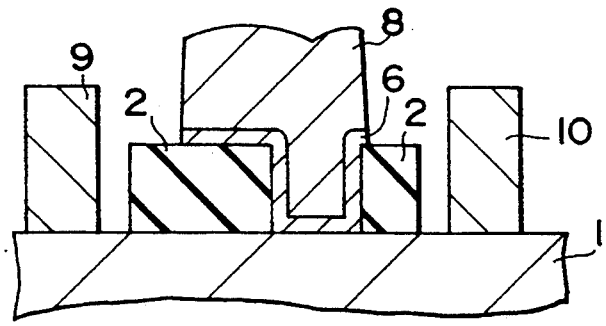
Figure 3A:
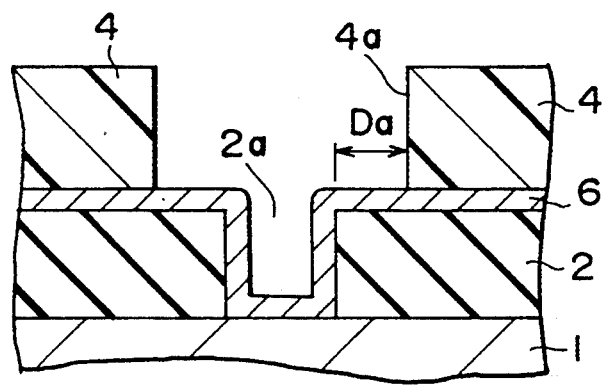
FIGS. 3A and 3B are sections of semiconductor chip illustrating the drawback in the conventional fabrication method.
Figure 3B:
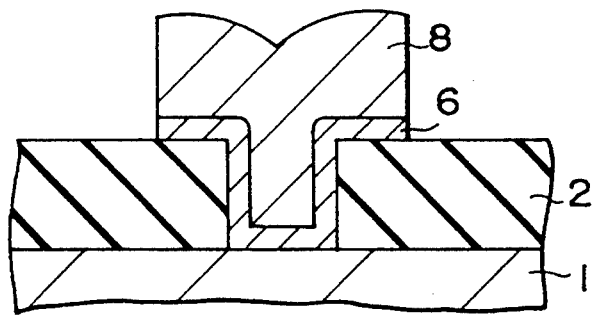
Figure 4A:
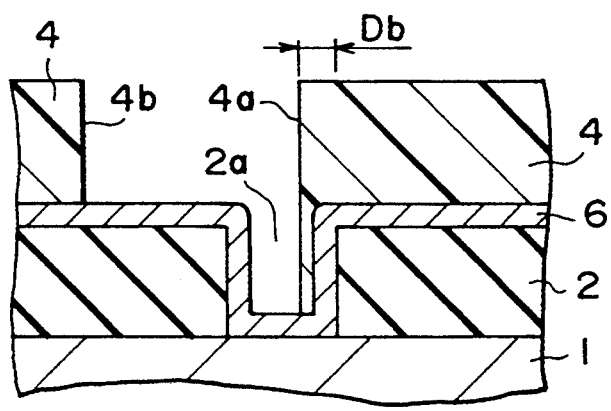
FIGS. 4A and 4B are sections of the semiconductor chip similar to FIGS. 3A and 3B and illustrating the drawback in the conventional fabrication method.
Figure 4B:
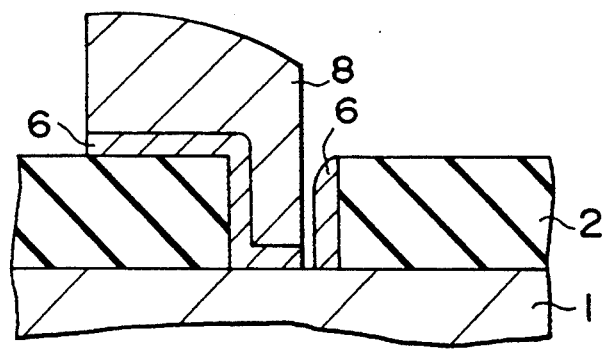
Figure 5A:
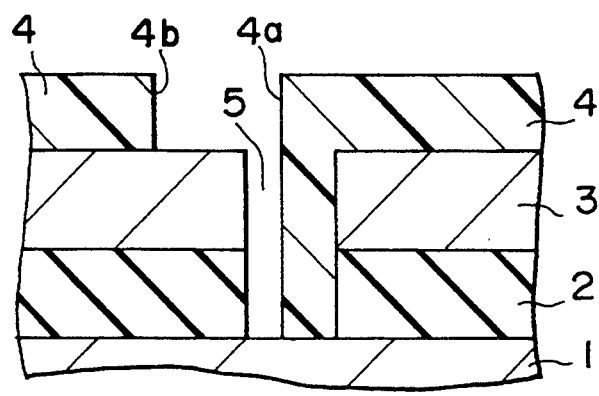
FIGS. 5A to 5F are sections showing a sequence of process steps of the preferred embodiment of a compound semiconductor device fabrication process according to the present invention.

At first, as shown in FIG. 5A, 400 nm thick of a silicon oxide layer 2 (a first insulation layer) is formed by LPCVD method on a GaAs substrate 1 formed with an active layer. On the silicon oxide layer 2, 200 to 300 nm thick of amorphous silicon layer 3 (hereinafter referred to as α-Si layer) is formed. It should be noted that this α-Si layer 3 is a layer which can be selectively etched with respect to the silicon oxide layer 3 and the GaAs substrate 1. The layer which can be selectively etched with respect to the silicon oxide layer and the GaAs substrate 1 and can be formed at low temperature (lower than 500° C.) other than α-Si layer 3, may be silicon nitride (SIN) layer.

Next, on the α-Si layer 3, a first photoresist layer (not shown) is selectively formed. Then, with taking the first photoresist layer as a mask, dry etching of the α-Si layer 3 is performed by RIE employing $Cl_2/SF_6$ gas. Then, dry etching of the silicon oxide layer is performed by RIE employing $CHF_3/CF_4$ gas for forming a gate opening portion 5.

Subsequently, after removing the first photoresist layer, a second photoresist layer 4 is formed by lithographic technology. At this time, the side surface 4a of the photoresist layer 4 at the side of the drain electrode is arranged within the gate opening portion 5 or in contact with the side wall of the gate opening portion 5. On the other hand, the side surface 4b of the photoresist layer 4 at the side of the source electrode is positioned away from the edge of the gate opening portion 5 in the magnitude of 0.2 to 1.0 μm. Namely, the side surface 4a of the photoresist layer 4 at the side of the drain electrode may be placed at any position within the gate opening portion 5. Accordingly, since the gate length of a transistor of the compound semiconductor, for example, is typically greater than or equal to 0.5 μm, the margin to be provided in positioning the side surface 4a becomes at least 0.5 μm.

Figure 5B:
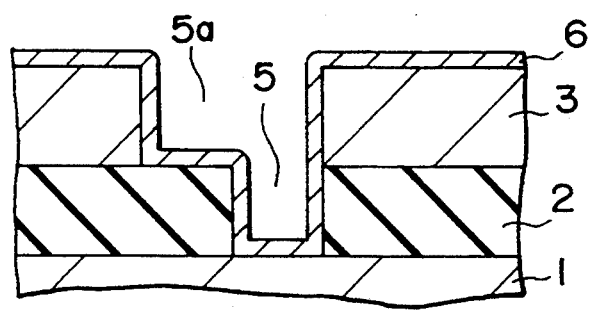

Then, as shown in FIG. 5B, with taking the photoresist layer 4 as a mask, the α-Si layer 3 is dry etched with a sole $SF_6$ gas or $Cl_2/SF_6$ gas to form an opening 5a. At this time, if the proportion of $SF_6$ gas becomes small, the GaAs substrate 1 can be etched. Therefore, the proportion of $SF_6$ gas should be greater than or equal to 50%.

Next, after removing the photoresist layer 4, a tungsten silicide (WSi) layer, a titanium nitride (TIN) layer and a platinum (Pt) layer are formed in stacking manner by deposition method or sputtering method to a form WSi•TiN•Pt layer as the first metal layer over the entire surface.

Figure 5C:
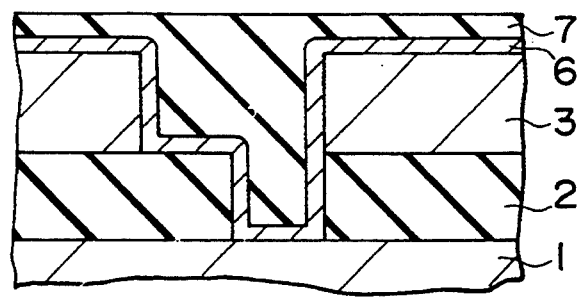

Next, as shown in FIG. 5C, a resist layer 7 is applied over the entire surface to fill the openings 5 and 5a and flatten the surface.

Figure 5D:
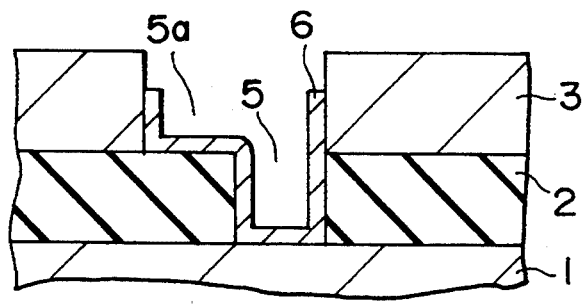

Next, as shown in FIG. 5D, etching back is performed over the entire surface. Then, the upper most etched surface of WSi•TiN•Pt layer 6 is removed until the α-Si layer 3 is completely exposed. As an etching method for removal of the WSi•TiN•Pt layer 6, RIE employing $SF_6$ gas or ion milling is preferred. Thereafter, residual resist layer 7 is removed.

Figure 5E:
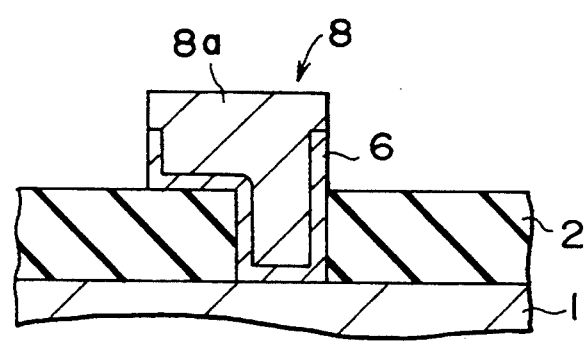

Then, as shown in FIG. 5E, with taking the WSi•TiN•Pt layer 6 as a plating path, electroplating of gold (Au) layer 8a is performed to form the reversed L-shaped gate electrode 8 formed with WSi•TiN•Pt layer 6 and the Au layer 8a.

Thereafter, employing $SF_6$ gas, dry etching is performed over the entire surface to selectively remove the α-Si layer 3. Upon this etching, by minimizing charging of ion energy bias, the α-Si layer 3 can be removed without causing etching in the gate electrode 8 and the silicon oxide layer 2.

Figure 5F:
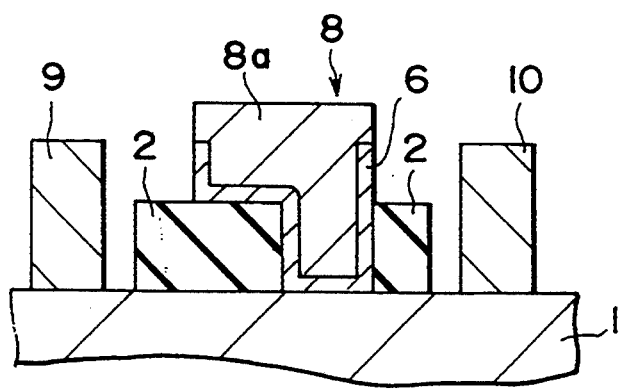

Subsequently, as shown in FIG. 5F, the silicon oxide layer 2 in the region of the source electrode 9 and the drain electrode 10 is selectively removed. Then, the source electrode 9 and the drain electrode 10 are selectively formed on the GaAs substrate 1. Thus, the semiconductor device with the reversed L-shaped gate electrode having an overhanging portion extending only toward the source electrode side can be fabricated.

In the step shown in FIG. 5A, if the silicon nitride layer is formed as a second layer instead of α-Si layer, the silicon nitride layer and the silicon oxide layer can be dry etched by RIE employing $CHF_3/CF_4$ gas for forming the gate opening portion 5. Also, the silicon nitride layer can be selectively etched by RIE employing $SF_6$ gas, $CF_4$ gas, $SF_6/O_2$ gas or $CF_4/O_2$ gas to form the opening 5a shown in FIG. 5B.

In the above-mentioned embodiment, the WSi•TiN•Pt layer is used as a first metal layer. However, sole Al layer or Ti•Al stacked layer can be used as the first metal layer.

Although the invention has been illustrated and described with respect to exemplary embodiment thereof, it should be understood by those skilled in the art that the foregoing and various other changes, omissions and additions may be made therein and thereto, without departing from the spirit and scope of the present invention. Therefore, the present invention should not be understood as limited to the specific embodiment set out above but to include all possible embodiments which can be embodies within a scope encompassed and equivalents thereof with respect to the feature set out in the appended claims.

What is claimed is:

1. A fabrication process of a compound semiconductor device comprising the steps of:

first step of forming a first insulation layer on an active layer provided in a compound semiconductor substrate;

second step of forming an insulative or a semi-insulative second layer on said first insulation layer, which second layer permitting selective etching with respect to said semiconductor substrate and said first insulation layer;

third step of forming a first opening portion for forming a gate electrode by locally and selectively etching said first insulation layer and said second layer sequentially for exposing the surface of said semiconductor substrate;

fourth step of forming a second opening portion having an upper portion common to said first opening portion by locally and selectively etching said second layer in the portion connected to said first opening portion at the side of source electrode;

fifth step of forming a first metal layer establishing a Shottky coupling with said semiconductor substrate over a surface including said first and second opening portions;

sixth step of removing said first metal layer at least a portion positioned above said second layer by applying a photoresist layer over entire surface for flattening the surface and subsequently etching back said photoresist layer; and seventh step of forming a reversed L-shaped gate electrode having a head portion extending toward the side of the source electrode by filling a second metal layer in said first and second opening portions by electroplating and by taking said first metal layer remaining in said first and second opening portions as a plating electrode.

2. A fabrication process of a compound semiconductor device as set forth in claim 1, which further comprises the steps of:
   removing said second layer;
   removing said first insulation layer at regions to form a source electrode and a drain electrode; and
   forming said source electrode and said drain electrode.

3. A fabrication process of a compound semiconductor device as set forth in claim 1, wherein said compound semiconductor substrate is a GaAs substrate.

4. A fabrication process of a compound semiconductor device as set forth in claim 1, wherein said first insulation layer is a silicon oxide layer.

5. A fabrication process of a compound semiconductor device as set forth in claim 1, wherein said second layer is a 200 to 300 nm thick amorphous silicon layer or silicon nitride layer.

6. A fabrication process of a compound semiconductor device as set forth in claim 5, wherein in the case where said second layer is the amorphous silicon layer,
   in said third step, said second layer is dry etched by RIE employing $Cl_2/SF_6$ gas and said first insulation layer is dry etched by RIE employing $CHF_3/CF_4$ gas, and
   in said fourth step, said second layer is selectively dry etched by RIE employing $SF_6$ gas or $Cl_2/SF_6$ gas.

7. A fabrication process of a compound semiconductor device as set forth in claim 5, wherein in the case where said second layer is the silicon nitride layer,
   in said third step, said second layer and said first insulation layer are dry etched by RIE employing $CHF_3/CF_4$ gas, and
   in said fourth step, said second layer is selectively dry etched by RIE employing $SF_6$ gas, $CF_4$ gas, $SF_6/O_2$ gas or $CF_4/O_2$ gas.

8. A fabrication process of a compound semiconductor device as set forth in claim 1, wherein said fourth step for forming said second opening portion forms a photoresist mask having an opening which opening having a side surface at the side of the drain electrode positioned within said first opening portion and a side surface at the side of the source electrode shifted away from said first opening portion toward the source electrode in a magnitude of 0.2 to 1.0 $\mu$m, on said second layer, and performs selective etching of said second layer with taking said photoresist mask as a mask.

9. A fabrication process of a compound semiconductor device as set forth in claim 1, wherein said first metal layer is a stacked layer of a tungsten silicide layer, a titanium nitride layer and a platinum layer.

10. A fabrication process of a compound semiconductor device as set forth in claim 1, wherein said first metal layer is a sole aluminum layer.

11. A fabrication process of a compound semiconductor device as set forth in claim 1, wherein said first metal layer is a stacked layer of a titanium layer and an aluminum layer.

12. A fabrication process of a compound semiconductor device as set forth in claim 1, wherein etching back in said sixth step is performed by RIE employing $SF_6$ gas or ion milling.

* * * * *

UNITED STATES PATENT AND TRADEMARK OFFICE
CERTIFICATE OF CORRECTION

PATENT NO. : 5,432,126
DATED      : July 11, 1995
INVENTOR(S) : Hirokazu OIKAWA

It is certified that error appears in the above-indentified patent and that said Letters Patent is hereby corrected as shown below:

Col. 2, line 55, delete "pm" insert -- μm --

Signed and Sealed this

Twenty-first Day of November, 1995

Attest:

BRUCE LEHMAN

*Attesting Officer*     *Commissioner of Patents and Trademarks*